United States Patent
Suda et al.

(10) Patent No.: US 11,342,194 B2
(45) Date of Patent: May 24, 2022

(54) SUBSTRATE PROCESSING METHOD AND SUBSTRATE PROCESSING APPARATUS

(71) Applicant: Tokyo Electron Limited, Tokyo (JP)

(72) Inventors: Ryutaro Suda, Miyagi (JP); Maju Tomura, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/092,376

(22) Filed: Nov. 9, 2020

(65) Prior Publication Data

US 2021/0159089 A1 May 27, 2021

Related U.S. Application Data

(60) Provisional application No. 63/017,998, filed on Apr. 30, 2020.

(30) Foreign Application Priority Data

Nov. 25, 2019 (JP) .............................. JP2019-212425
Sep. 15, 2020 (JP) .............................. JP2020-154668

(51) Int. Cl.
*H01L 21/3213* (2006.01)
*H01L 21/308* (2006.01)
(Continued)

(52) U.S. Cl.
CPC ...... *H01L 21/32137* (2013.01); *C23C 16/401* (2013.01); *C23C 16/52* (2013.01);
(Continued)

(58) Field of Classification Search
None
See application file for complete search history.

(56) References Cited

U.S. PATENT DOCUMENTS 4,595,453 A 6/1986 Yamazaki et al.
9,831,097 B2 * 11/2017 Ingle ................. H01L 21/32137
(Continued)

FOREIGN PATENT DOCUMENTS

JP 06-168914 A 6/1994
JP H06-168914 A 6/1994
(Continued)

OTHER PUBLICATIONS

G. Smolinsky et al., "Plasma Etching of Silicon and Silicon Dioxide with Hydrogen Fluoride Mixtures", Journal of The Electrochemical Society, vol. 129, No. 8, Aug. 1982, pp. 1770-1772, XP55839444A.
(Continued)

*Primary Examiner* — Jiong-Ping Lu
(74) *Attorney, Agent, or Firm* — Xsensus LLP

(57) ABSTRACT

A technique improves selectivity in etching of a silicon-containing film over etching of a mask in plasma etching. A substrate processing method includes placing a substrate in a chamber in a plasma processing apparatus. The substrate includes a silicon-containing film and a mask on the silicon-containing film. The substrate processing method further includes generating plasma from a first process gas containing a hydrogen fluoride gas in the chamber. The generating plasma includes etching the silicon-containing film with a chemical species contained in the plasma. A flow rate of the hydrogen fluoride gas is at least 80 vol % of a total flow rate of non-inert components of the first process gas.

39 Claims, 8 Drawing Sheets

(51) Int. Cl.

| | |
|---|---|
| *H01L 21/02* | (2006.01) |
| *H01J 37/32* | (2006.01) |
| *C23C 16/52* | (2006.01) |
| *C23C 16/40* | (2006.01) |
| *H01L 21/3065* | (2006.01) |
| *H01L 21/311* | (2006.01) |
| *H01L 21/67* | (2006.01) |
| *H01L 21/683* | (2006.01) |

(52) U.S. Cl.
CPC .. *H01J 37/32091* (2013.01); *H01J 37/32449* (2013.01); *H01J 37/32724* (2013.01); *H01J 37/32862* (2013.01); *H01L 21/02164* (2013.01); *H01L 21/308* (2013.01); *H01L 21/3065* (2013.01); *H01L 21/31116* (2013.01); *H01L 21/31144* (2013.01); *H01L 21/32139* (2013.01); *H01L 21/67069* (2013.01); *H01L 21/6831* (2013.01); *H01J 2237/2007* (2013.01); *H01J 2237/334* (2013.01)

(56) References Cited

U.S. PATENT DOCUMENTS

| | | | |
|---|---|---|---|
| 2001/0052350 A1* | 12/2001 | Chow | H01J 37/32862 134/1.1 |
| 2017/0178915 A1 | 6/2017 | Ingle et al. | |
| 2018/0114679 A1* | 4/2018 | Shah | C23C 16/4404 |

FOREIGN PATENT DOCUMENTS

| | | |
|---|---|---|
| JP | 2016-39310 A | 3/2016 |
| JP | 2016-219786 A | 12/2016 |
| WO | 2020/150100 A1 | 7/2020 |

OTHER PUBLICATIONS

Smolinsky, G. et al, "Plasma Etching of Silicon and Silicon Dioxide with Hydrogen Fluoride Mixtures", journal of The Electrochemical Society, vol. 129, the No. 8, the pp. 1770-1772, and 1982.

* cited by examiner

SUBSTRATE PROCESSING METHOD AND SUBSTRATE PROCESSING APPARATUS

CROSS-REFERENCE TO RELATED APPLICATIONS

This application claims the benefit of the earlier filing date of U.S. Provisional Application No. 63/017,998, filed Apr. 30, 2020, and claims priority to Japanese Patent Application No. 2019-212425 filed on Nov. 25, 2019, and Japanese Patent Application No. 2020-154668, filed Sep. 15, 2020, the entire disclosures of all of which are incorporated herein by reference.

BACKGROUND

Technical Field

Exemplary embodiments of the present disclosure relate to a substrate processing method and a plasma processing apparatus.

Description of the Background

A method for etching a film included in a substrate is described in Patent Literature 1. The film contains silicon. The substrate further includes a mask on the film. The mask contains amorphous carbon or an organic polymer. The etching uses plasma generated from a process gas containing a hydrocarbon gas and a hydrofluorocarbon gas.

CITATION LIST

Patent Literature

Patent Literature 1: Japanese Unexamined Patent Application Publication No. 2016-39310

BRIEF SUMMARY

The present disclosure is directed to a technique for improving selectivity in etching of a silicon-containing film over etching of a mask in plasma etching.

A substrate processing method according to an aspect of the present disclosure includes placing a substrate in a chamber in a plasma processing apparatus. The substrate includes a silicon-containing film and a mask on the silicon-containing film. The substrate processing method further includes generating plasma from a first process gas containing a hydrogen fluoride gas in the chamber. The generating plasma includes etching the silicon-containing film with a chemical species contained in the plasma. A flow rate of the hydrogen fluoride gas is at least 80 vol % of a total flow rate of non-inert components of the first process gas.

The exemplary technique according to the present disclosure improves selectivity in etching of the silicon-containing film over etching of the mask in plasma etching.

DETAILED DESCRIPTION

Figure 1:
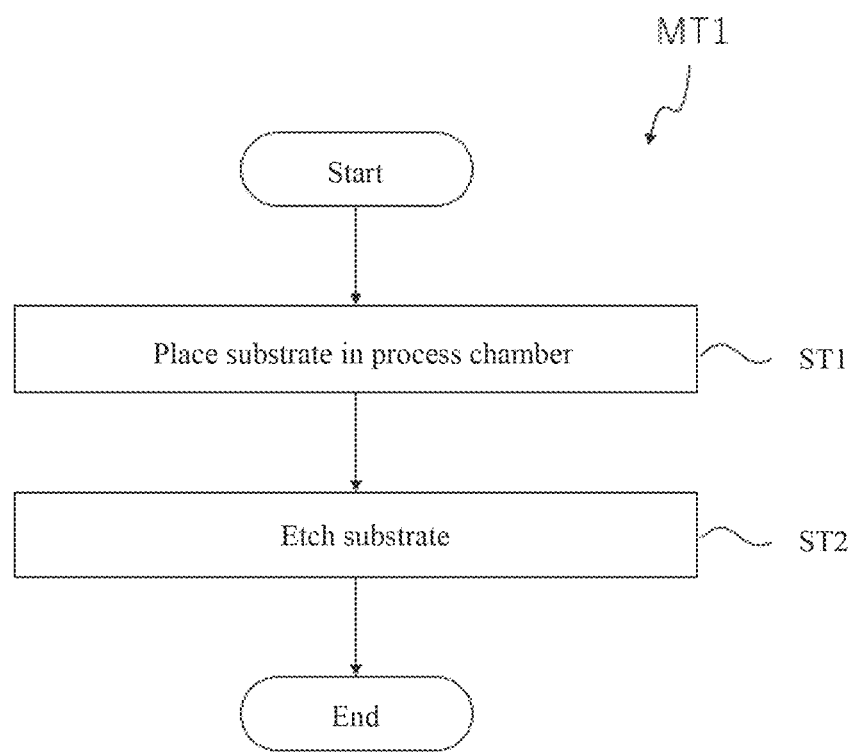
FIG. 1 is a flowchart of an exemplary substrate processing method according to a first embodiment.

Exemplary embodiments will now be described.

A substrate processing method according to an exemplary embodiment includes placing a substrate in a chamber in a plasma processing apparatus. The substrate includes a silicon-containing film and a mask on the silicon-containing film. The substrate processing method further includes generating plasma from a first process gas containing a hydrogen fluoride gas in the chamber. The generating plasma includes etching the silicon-containing film with a chemical species contained in the plasma. A flow rate of the hydrogen fluoride gas is at least 80 vol % of a total flow rate of non-inert components of the first process gas. The method according to the embodiment improves selectivity in etching of the silicon-containing film over etching of the mask in plasma etching with the plasma generated from the first process gas containing the hydrogen fluoride gas being at least 80 vol % of the total flow rate of non-inert components of the first process gas.

In one exemplary embodiment, the first process gas may contain at least one selected from the group consisting of a carbon-containing gas, an oxygen-containing gas, and a halogen-containing gas.

In one exemplary embodiment, the carbon-containing gas may contain at least one selected from the group consisting of a fluorocarbon gas, a hydrofluorocarbon gas, and a hydrocarbon gas.

In one exemplary embodiment, the silicon-containing film may include at least one selected from the group consisting of a film stack including a silicon oxide film and a silicon nitride film, a polysilicon film, a film with a low dielectric constant, and a film stack including a silicon oxide film and a polysilicon film.

In one exemplary embodiment, the mask may include a carbon-containing mask or a metal-containing mask.

In one exemplary embodiment, the carbon-containing mask may include at least one selected from the group consisting of spin-on carbon, tungsten carbide, amorphous carbon, and boron carbide.

In one exemplary embodiment, the substrate processing method may further include generating plasma from a second process gas in the chamber. The generating plasma from the second process gas includes cleaning an inside of the chamber with a chemical species contained in the plasma.

In one exemplary embodiment, the second process gas may contain at least one selected from the group consisting of a fluorine-containing gas, an oxygen-containing gas, a hydrogen-containing gas, and a nitrogen-containing gas.

In one exemplary embodiment, the substrate processing method may further include generating plasma from a third process gas in the chamber before the placing the substrate.

The generating plasma from the third process gas includes depositing a precoat film on an inner wall of the chamber.

In one exemplary embodiment, the third process gas may contain a silicon-containing gas and an oxygen-containing gas.

A plasma processing apparatus according to another exemplary embodiment includes a chamber, a plasma generator, and a controller. The chamber has a gas inlet and a gas outlet. The controller causes placing a substrate including a silicon-containing film and a mask on the silicon-containing film in the chamber, and generating plasma from a first process gas containing a hydrogen fluoride gas in the chamber and etching the silicon-containing film. In the generating plasma and the etching, the controller controls a flow rate of the hydrogen fluoride gas to at least 80 vol % of a total flow rate of non-inert components of the first process gas.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

First Embodiment

Figure 2:
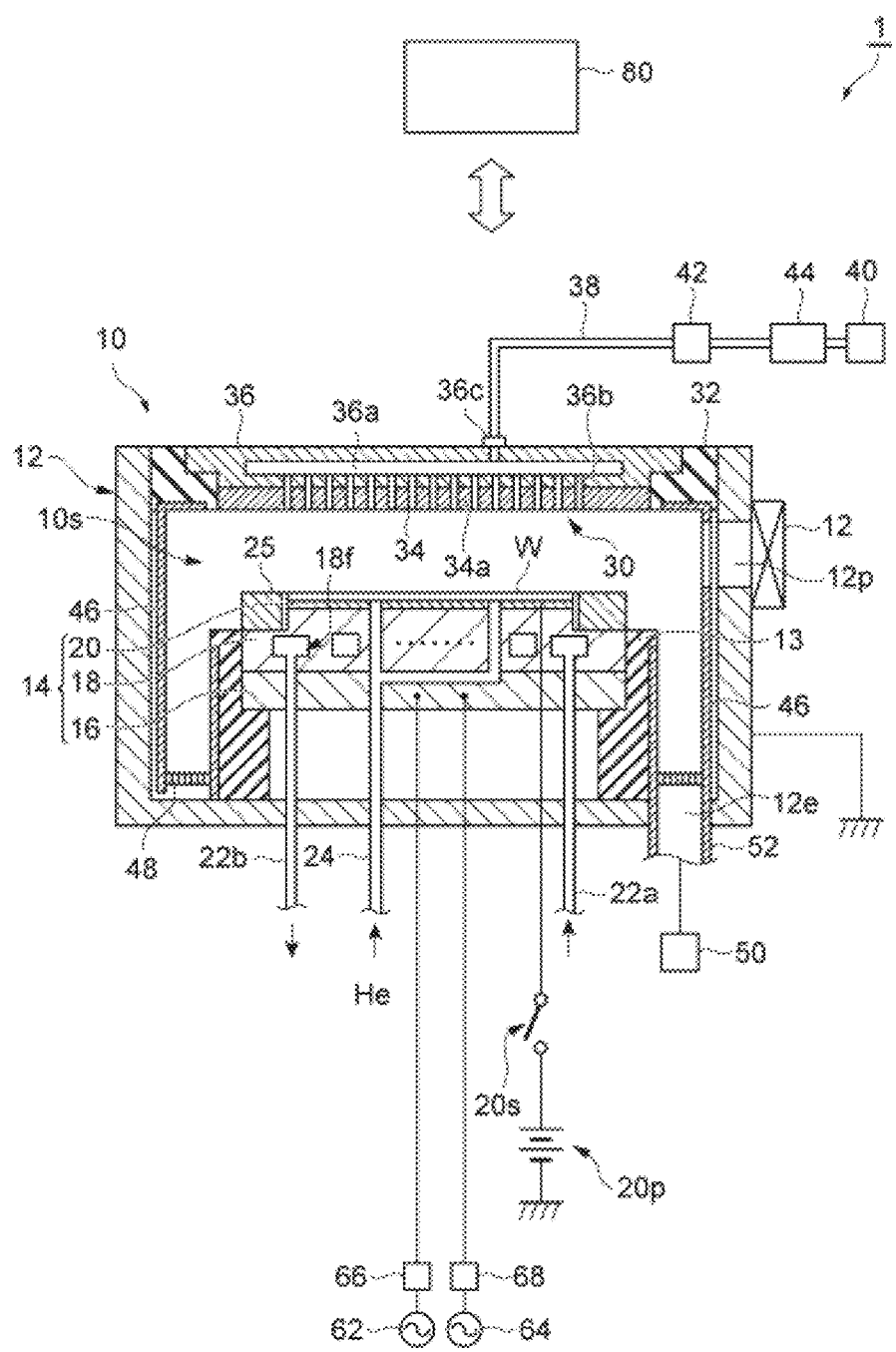
FIG. 2 is a schematic diagram of an exemplary plasma processing apparatus according to an embodiment.

FIG. 1 is a flowchart of an exemplary substrate processing method according to a first embodiment. With a method MT1 shown in FIG. 1, a film containing silicon is etched. The method MT1 may be used in manufacturing, for example, a NAND flash memory with a three-dimensional structure. The method MT1 is used by a plasma processing apparatus. FIG. 2 is a schematic diagram of an exemplary plasma processing apparatus. The method MT1 shown in FIG. 1 may be used by a plasma processing apparatus 1 shown in FIG. 2.

The plasma processing apparatus 1 includes a chamber 10 with an internal space 10s. The chamber 10 includes a chamber body 12, which is substantially cylindrical. The chamber body 12 is formed from, for example, aluminum. The chamber body 12 has inner walls coated with an anticorrosive film, which may be formed from ceramic such as aluminum oxide or yttrium oxide.

The chamber body 12 has a side wall having a port 12p. A substrate W is transferred between the internal space 10s and the outside of the chamber 10 through the port 12p. The port 12p is open and closed by a gate valve 12g that is on the side wall of the chamber body 12.

A support 13 is on the bottom of the chamber body 12. The support 13 is substantially cylindrical and is formed from an insulating material. The support 13 extends upward from the bottom of the chamber body 12 into the internal space 10s. The support 13 includes an upper substrate support 14. The substrate support 14 supports the substrate W in the internal space 10s.

The substrate support 14 includes a lower electrode 18 and an electrostatic chuck (ESC) 20. The substrate support 14 may further include an electrode plate 16. The electrode plate 16 is formed from a conductor such as aluminum and is substantially disk-shaped. The lower electrode 18 is on the electrode plate 16. The lower electrode 18 is formed from a conductor such as aluminum and is substantially disk-shaped. The lower electrode 18 is electrically coupled to the electrode plate 16.

The ESC 20 is on the lower electrode 18. The substrate W is placed on an upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct-current (DC) power supply $20p$ via a switch $20s$. A voltage is applied from the DC power supply $20p$ to the electrode in the ESC 20 to generate an electrostatic attraction between the ESC 20 and the substrate W, thus causing the ESC 20 to hold the substrate W.

An edge ring 25 is on the periphery of the lower electrode 18 to surround an edge of the substrate W. The edge ring 25 allows more uniform processing across the surface of the substrate W with plasma. The edge ring 25 may be formed from silicon, silicon carbide, or quartz.

The lower electrode 18 has an internal channel $18f$ for carrying a heat-exchange medium (e.g., refrigerant) being supplied through a pipe $22a$ from a chiller unit (not shown) external to the chamber 10. The heat-exchange medium being supplied to the channel $18f$ returns to the chiller unit through a pipe $22b$. In the plasma processing apparatus 1, the temperature of the substrate W on the ESC 20 is adjusted through heat exchange between the heat-exchange medium and the lower electrode 18.

The plasma processing apparatus 1 includes a gas supply line 24, which supplies a heat-transfer gas (e.g., He gas) from a heat-transfer gas supply assembly to between the upper surface of the ESC 20 and a back surface of the substrate W.

The plasma processing apparatus 1 further includes an upper electrode 30 that is located above the substrate support 14. The upper electrode 30 is supported on an upper portion of the chamber body 12 with a member 32, which is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space $10s$. The ceiling plate 34 is formed from a low resistance conductor or a semiconductor that generates less Joule heat. The ceiling plate 34 has multiple gas outlet holes $34a$ that are through-holes in the thickness direction.

The support member 36 supports the ceiling plate 34 in a detachable manner. The support member 36 is formed from a conductive material such as aluminum. The support member 36 has an internal gas-diffusion compartment $36a$. The support member 36 has multiple gas holes $36b$ that extend downward from the gas-diffusion compartment $36a$. The gas holes $36b$ communicate with the respective gas outlet holes $34a$. The support member 36 has a gas inlet $36c$. The gas inlet $36c$ connects to the gas-diffusion compartment $36a$. The gas inlet $36c$ also connects to a gas supply pipe 38.

The gas supply pipe 38 is connected to a set of valves 42, a set of flow controllers 44, and a set of gas sources 40. The gas source set 40, the valve set 42, and the flow controller set 44 form a gas supply unit. The gas source set 40 includes multiple gas sources. The valve set 42 includes multiple open-close valves. The flow controller set 44 includes multiple flow controllers. The flow controllers in the flow controller set 44 are mass flow controllers or pressure-based flow controllers. The gas sources in the gas source set 40 are connected to the gas supply pipe 38 via the respective open-close valves in the valve set 42 and via the respective flow controllers in the flow controller set 44.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film. The anticorrosive film may be a film of ceramic such as yttrium oxide.

A baffle plate 48 is located between the support 13 and the side wall of the chamber body 12. The baffle plate 48 includes, for example, an aluminum base coated with an anticorrosive film (e.g., yttrium oxide film). The baffle plate 48 has multiple through-holes. The chamber body 12 has a gas outlet 12e in its bottom below the baffle plate 48. The gas outlet 12e connects to an exhaust device 50 through an exhaust pipe 52. The exhaust device 50 includes a pressure control valve and a vacuum pump such as a turbomolecular pump.

The plasma processing apparatus 1 includes a first radio-frequency (RF) power supply 62 and a second RF power supply 64. The first RF power supply 62 generates first RF power. The first RF power has a frequency suitable for generating plasma. The first RF power has a frequency ranging from, for example, 27 to 100 MHz. The first RF power supply 62 is coupled to the lower electrode 18 via an impedance matching circuit, or matcher 66, and the electrode plate 16. The matcher 66 includes a circuit for matching the output impedance of the first RF power supply 62 and the impedance of a load (the lower electrode 18). The first RF power supply 62 may be coupled to the upper electrode 30 via the matcher 66. The first RF power supply 62 serves as an exemplary plasma generator.

The second RF power supply 64 generates second RF power. The second RF power has a lower frequency than the first RF power. The second RF power, when used in addition to the first RF power, serves as bias RF power for drawing ions toward the substrate W. The second RF power has a frequency ranging from, for example, 400 kHz to 13.56 MHz. The second RF power supply 64 is coupled to the lower electrode 18 via an impedance matching circuit, or matcher 68, and the electrode plate 16. The matcher 68 includes a circuit for matching the output impedance of the second RF power supply 64 and the impedance of a load (the lower electrode 18).

The second RF power alone may be used to generate plasma, without the first RF power being used. In other words, a single RF power may be used to generate plasma. In this case, the second RF power may have a frequency higher than 13.56 MHz, or for example, 40 MHz. The plasma processing apparatus 1 may not include the first RF power supply 62 and the matcher 66. The second RF power supply 64 serves as an exemplary plasma generator.

In the plasma processing apparatus 1, the gas supply unit supplies a gas into the internal space 10s to generate plasma. The first RF power and/or the second RF power are provided to form, between the upper electrode 30 and the lower electrode 18, an RF electric field, which then generates plasma.

The plasma processing apparatus 1 may further include a controller 80. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data.

Referring back to FIG. 1, the method MT1 used by the plasma processing apparatus 1 will be described by way of example. As shown in FIG. 1, the method MT1 includes step ST1. In step ST1, a substrate W is placed in the chamber 10 in the plasma processing apparatus 1. The substrate W is placed onto and held by the ESC 20.

Figure 3:
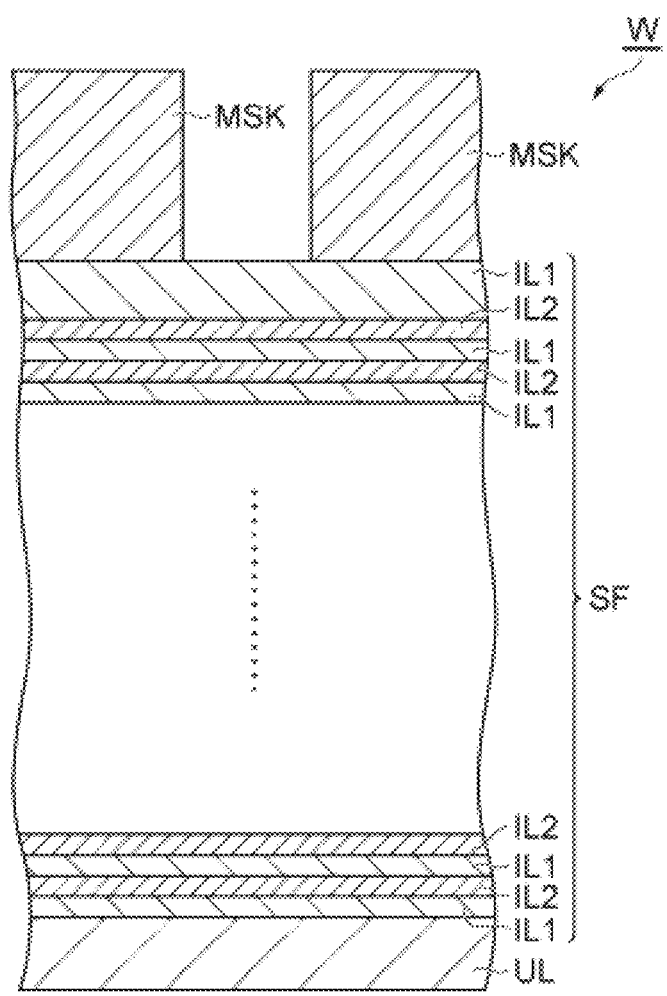
FIG. 3 is a partially enlarged cross-sectional view of an exemplary substrate placed in step ST1.

FIG. 3 is a partially enlarged cross-sectional view of an exemplary substrate placed in step ST1 of the method MT1. The substrate W shown in FIG. 3 includes an underlayer UL, a film SF, and a mask MSK. The underlayer UL may be a polycrystalline silicon layer. The film SF contains silicon and is on the underlayer UL. The film SF may be a film stack including one or more silicon oxide films and one or more silicon nitride films. The film SF shown in FIG. 3 is a multilayer including multiple silicon oxide films IL1 and multiple silicon nitride films IL2. The silicon oxide films IL1 and the silicon nitride films IL2 are stacked alternately. The film SF may be another single layer containing silicon or another multilayer containing silicon. The film SF as a single layer may be a low-dielectric-constant film formed from, for example, SiOC, SiOF, or SiCOH, or may be a polysilicon film. The film SF as a multilayer may be a film stack including one or more silicon oxide films and one or more polysilicon films.

The mask MSK is on the film SF and has a pattern for forming a recess such as a hole in the film SF. The mask MSK may be, for example, a hard mask. The mask MSK may be, for example, a carbon-containing mask and/or a metal-containing mask. The carbon-containing mask is formed from, for example, at least one selected from the group consisting of spin-on carbon, tungsten carbide, amorphous carbon, and boron carbide. The metal-containing mask is formed from, for example, at least one selected from the group consisting of titanium nitride, titanium oxide, and tungsten. The mask MSK may be a boron-containing mask formed from, for example, silicon boride, boron nitride, or boron carbide.

As shown in FIG. 1, the method MT1 further includes step ST2, which follows step ST1. In step ST2, plasma is generated from a first process gas in the chamber 10. In step ST2, the film SF is etched with a chemical species contained in the plasma.

The first process gas used in step ST2 contains a hydrogen fluoride gas. In step ST2, the flow rate of the hydrogen fluoride gas may be at least 80 vol %, 85 vol %, 90 vol %, or 95 vol % of the total flow rate of non-inert components of the first process gas. To reduce failures such as bowing in the resultant features of the film SF, the flow rate of the hydrogen fluoride gas may be less than 100 vol % or not more than 99.5 vol % of the total flow rate of non-inert components of the first process gas. In one example, the flow rate of the hydrogen fluoride gas is controlled to be within the range of 98 vol % to 99.5 vol % of the total flow rate of non-inert components of the first process gas. The flow rate of the hydrogen fluoride gas with respect to the flow rate of the non-inert components of first process gas is controlled within the above range to allow the etching rate of the film SF to be higher than the etching rate of the mask MSK. This improves selectivity in etching of the silicon-containing film over etching of the mask. With the flow rate of the hydrogen fluoride gas less than 80 vol % of the flow rate of non-inert components of the first process gas, the selectivity cannot be improved sufficiently. The total flow rate of non-inert components of the first process gas may be controlled as appropriate in accordance with the capacity of the chamber, and may be, for example, 100 sccm or more.

The first process gas containing the hydrogen fluoride gas may further contain at least one selected from the group consisting of a carbon-containing gas, an oxygen-containing gas, and a halogen-containing gas.

With the first process gas containing a carbon-containing gas, deposits containing carbon may form on the surface of the mask, thus further improving selectivity in etching of the silicon-containing film over etching of the mask. The carbon-containing gas may contain, for example, at least one selected from the group consisting of a fluorocarbon gas, a hydrofluorocarbon gas, and a hydrocarbon gas. The fluorocarbon gas may be, for example, $CF_4$, $C_2F_2$, $C_2F_4$, $C_3F_8$, $C_4F_6$, $C_4F_8$, or $C_5F_8$. The hydrofluorocarbon gas may be, for example, $CHF_3$, $CH_2F_2$, $CH_3F$, $C_2HF_5$, $C_2H_2F_4$, $C_2H_3F_3$, $C_2H_4F_2$, $C_3HF_7$, $C_3H_2F_6$, $C_3H_2F_4$, $C_3H_3F_5$, $C_4H_5F_5$, $C_5H_2F_{10}$, c-$C_5H_3F_7$, or $C_3H_2F_4$. The hydrocarbon gas may be, for example, $CH_4$, $C_2H_6$, $C_3H_6$, $C_3H_8$, or $C_4H_{10}$. The carbon-containing gas containing any of the above gases may further contain CO and/or $CO_2$. In one example, a hydrofluorocarbon gas having two or more carbon atoms can be used as the carbon-containing gas. When a hydrofluorocarbon gas having 2 or more carbon atoms is used, failures, such as bowing, can be effectively suppressed.

With the first process gas containing an oxygen-containing gas, the opening in the mask is less likely to be closed during etching. The oxygen-containing gas may contain, for example, at least one selected from the group consisting of $O_2$, CO, $CO_2$, $H_2O$, and $H_2O_2$.

With the first process gas containing a halogen-containing gas, the etched features can be controlled. The halogen-containing gas may contain at least one selected from the group consisting of fluorine-containing gases including $SF_6$, $NF_3$, $XeF_2$, $SiF_4$, $IF_7$, $ClF_5$, $BrF_5$, $AsF_5$, $NF_5$, $PF_3$, $PF_5$, $POF_3$, $BF_3$, $HPF_6$, and $WF_6$, chlorine-containing gases including $SiCl_2$, $SiCl_4$, $CCl_4$, $BCl_3$, $PCl_3$, $PCl_5$, and $POCl_3$, boron-containing gases including $CBr_2F_2$, $C_2F_5Br$, $PBr_3$, $PBr_5$, and $POBr_3$, and iodine-containing gases including HI, $CF_3I$, $C_2F_5I$, $C_3F_7I$, $IF_5$, $IF_7$, $I_2$, and $PI_3$.

In addition to any of the above gas species, the first process gas may contain a gas that effectively protects the side wall, or specifically, a sulfur-containing gas such as COS, a phosphorus-containing gas such as $P_4O_{10}$, $P_4O_8$, $P_4O_6$, $PH_3$, $Ca_3P_2$, $H_3PO_4$, or $Na_3PO_4$, or a bromine-containing gas such as $B_2H_6$.

In addition to any of the above gas species, the first process gas may also contain an inert gas, or more than one inert gas. The inert gas(es) may contain a noble gas such as Ar, Kr, or Xe, or a nitrogen-containing gas. In the first process gas, the ratio of the flow rate of the hydrogen fluoride gas with respect to the total flow rate of non-inert components of the first process gas is controlled within the range specified above.

To perform the processing in step ST2, the controller 80 controls the gas supply unit to supply the above process gas into the chamber 10. To perform the processing in step ST2, the controller 80 controls the gas supply unit to supply the process gas containing the hydrogen fluoride gas with the flow rate being at least 80 vol % of the total flow rate of the process gas into the chamber 10. To perform the processing in step ST2, the controller 80 controls the exhaust device 50 to maintain the chamber 10 at a specified pressure. To perform the processing in step ST2, the controller 80 controls the first RF power supply 62 and/or the second RF power supply 64 to provide the first RF power and/or the second RF power to generate plasma from the process gas in the chamber 10.

In step ST2, the second RF power supply 64 may provide second RF power (in other words, bias RF power) of at least 5 W/cm² to the lower electrode 18 to draw ions in the plasma toward the substrate W. With the second RF power of at least 5 W/cm², ions in the plasma can readily reach the bottom of a recess in the film SF formed through etching (e.g., a recess SP in FIG. 4). A negative DC voltage, in place of the bias RF power, may be applied to the lower electrode 18. The bias RF power or the negative DC voltage may be applied to the lower electrode 18 in pulses. The pulse frequency may be 5 Hz to 100 kHz.

The ESC may be at any temperature in step ST2. However, the ESC may be adjusted to a lower temperature of, for example, 0° C. or lower, or −50° C. or lower, before step ST2 is started to facilitate adsorption of the etchant on the substrate surface, thus improving the etching rate.

Figure 4:
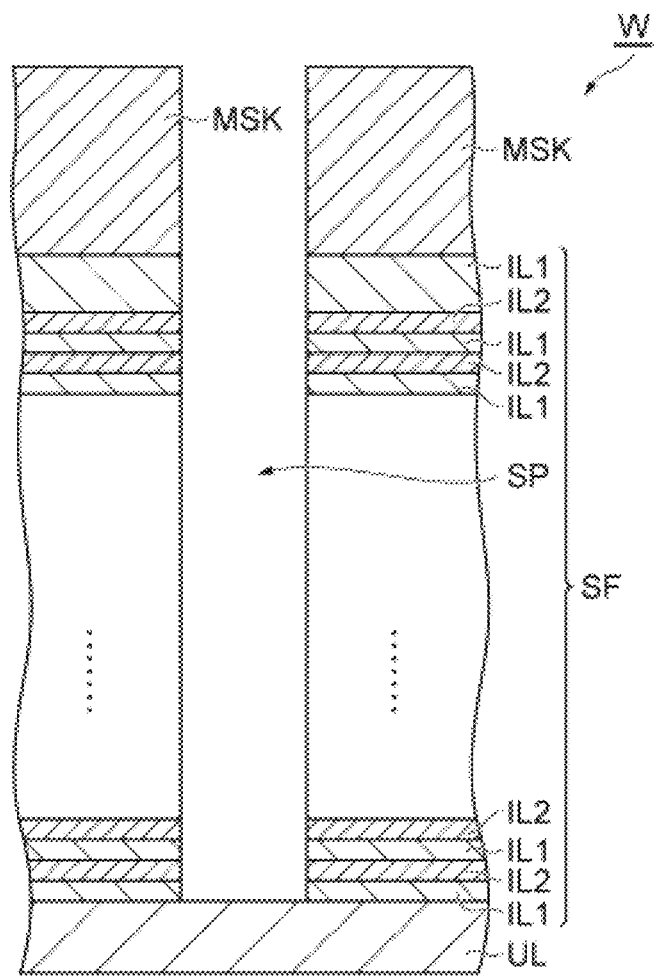
FIG. 4 is a partially enlarged cross-sectional view of the exemplary substrate after being processed with the substrate processing method shown in FIG. 1.

When the processing in step ST2 is complete, the method MT1 completes. FIG. 4 is a partially enlarged cross-sectional view of the substrate after being processed with the substrate processing method shown in FIG. 1. With the method MT1, the recess SP may extend through the film SF and reach the underlayer UL as shown in FIG. 4.

The results of an experiment conducted for evaluating the method MT1 will now be described. In the experiment, eight sample substrates identical to the substrate W shown in FIG. 3 were prepared. In the experiment, the film SF in each of the eight sample substrates underwent plasma etching using the plasma processing apparatus 1. The plasma etching uses a first process gas containing a carbon-containing gas. A first sample substrate, among the eight sample substrates, underwent plasma etching using a first process gas containing no hydrogen fluoride gas. Second to eighth sample substrates, among the eight sample substrates, each underwent plasma etching using a first process gas containing a hydrogen fluoride gas having a flow rate ratio varying from 34.2 vol %, 51.0 vol %, 80.0 vol %, 95.2 vol %, 98.8 vol %, 99.5 vol %, and to 100 vol % with respect to the total flow rate of the first process gas. In the experiment, the ESC onto which each sample substrate is to be placed is adjusted to a temperature of −50° C. or lower before the plasma etching is started.

In the experiment, the selectivity in etching of the films SF over etching of the mask MSK was determined based on the resultant films SF after plasma etching in the eight sample substrates. More specifically, the selectivity was determined by dividing the etching rate of the film SF by the etching rate of the mask MSK based on the resultant film SF after plasma etching in each of the eight sample substrates.

Figure 5:
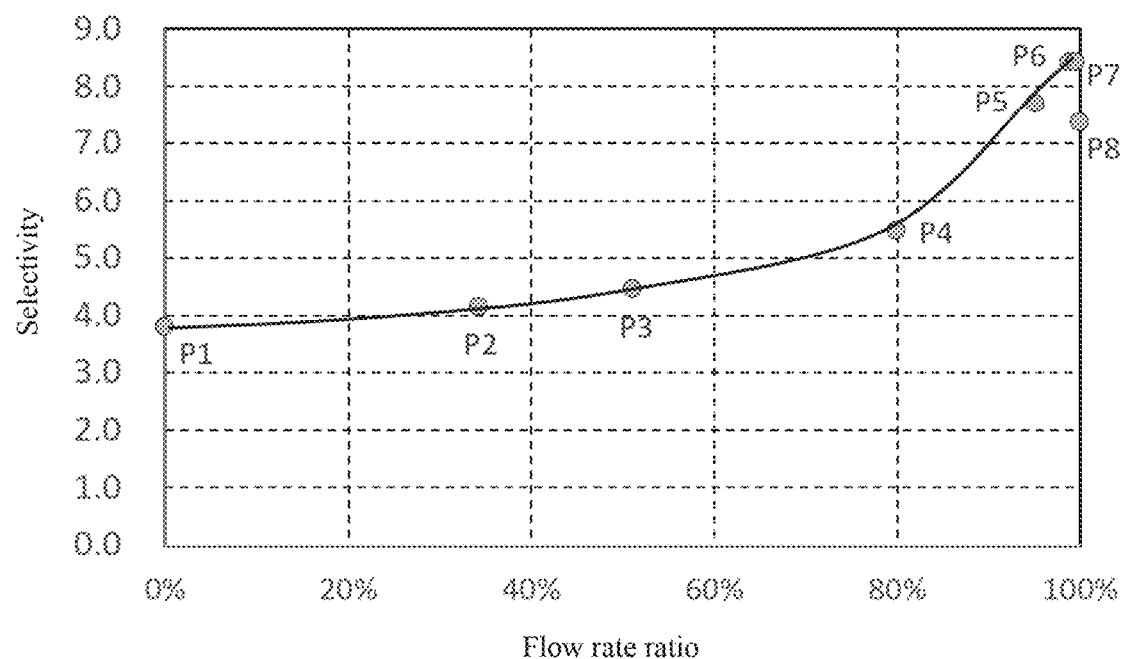
FIG. 5 is a graph showing the results of an experiment conducted for evaluating the substrate processing method shown in FIG. 1.

FIG. 5 shows the results of the experiment. FIG. 5 is a graph showing the results of the experiment conducted for evaluating the substrate processing method shown in FIG. 1. In the graph of FIG. 5, the horizontal axis indicates the flow rate ratio. The flow rate ratio refers to the ratio (vol %) of the flow rate of the hydrogen fluoride gas with respect to the total flow rate of non-inert components of the first process gas. In the graph of FIG. 5, the vertical axis indicates the selectivity. In FIG. 5, plots P1 to P8 indicate the selectivity determined from the resultant films SF after plasma etching performed using the first to eighth sample substrates.

As shown in FIG. 5, the experimental results reveal that the selectivity increases as the ratio (hereinafter referred to as the flow rate ratio) of the flow rate of the hydrogen fluoride gas with respect to the total flow rate of non-inert components of the first process gas increases. In particular, the selectivity increases more (the gradient is steeper in the graph of FIG. 5) at flow rate ratio of at least 80 vol % than at flow rate ratio of less than 80 vol %. This may be explained as follows. At flow rate ratio of less than 80 vol %, the silicon-containing film is etched at a higher etching rate for a higher flow rate ratio, thus increasing the selectivity. However, the mask is also etched by a certain degree in this range. The selectivity thus increases relatively slowly. At flow rate ratio of at least 80 vol %, the silicon-containing film is likely to be etched at a saturated etching rate, but the mask is etched at a lower etching rate. The selectivity thus increases. More specifically, at flow rate ratio of at least 80 vol %, the silicon-containing film remains etched at a higher etching rate but almost no portion of the mask is etched. The selectivity thus increases at a higher rate.

As shown in FIG. 5, when the flow rate of the hydrogen fluoride gas is at least 80 vol % of the total flow rate of non-inert components of the first process gas, the selectivity is 5 or more. In particular, when the flow rate of the hydrogen fluoride gas is at least 90 vol % of the total flow rate of non-inert components of the first process gas is excluded, the selectivity is 7 or more. When the flow rate ratio is at least 95 vol %, the selectivity is 7.5 or more.

Second Embodiment

With the substrate processing method according to the first embodiment, increasing amounts of reaction product accumulate on the inner walls of the chamber 10 or on the substrate support 14 as the processing is performed over a repeated number of times. As more reaction product accumulates, the processing environment changes, possibly affecting uniformity in the processing across substrates W. As more reaction product accumulates, particles may also form. The inside of the chamber is cleaned with plasma generated from a cleaning gas.

Figure 6:
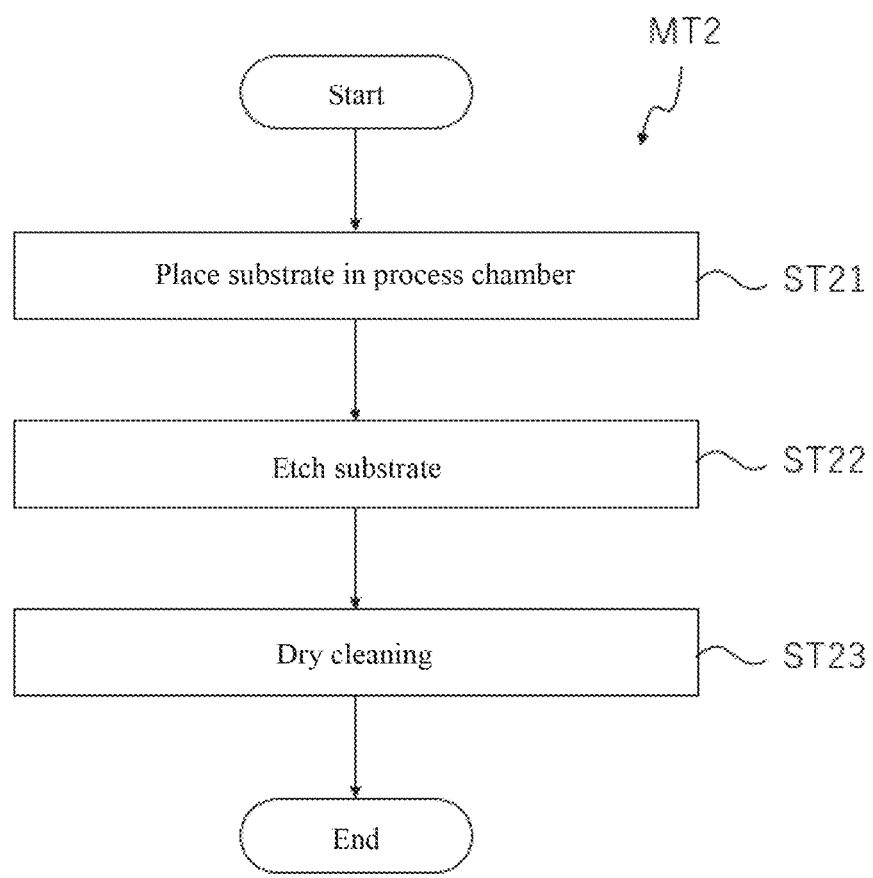
FIG. 6 is a flowchart of an exemplary substrate processing method according to a second embodiment.

FIG. 6 is a flowchart of an exemplary substrate processing method according to a second embodiment. With a method MT2 shown in FIG. 6, a silicon-containing film is etched, as with the method MT1. Steps ST21 and ST22 are identical to steps ST1 and ST2 included in the method MT1 described above, and will not be described.

As shown in FIG. 6, the method MT2 further includes step ST23, which follows step ST22. In step ST23, plasma is generated from a second process gas in the chamber 10. In step ST23, the inside of the chamber 10 is cleaned with a chemical species contained in the plasma. The processing time of step ST23 is normally determined by monitoring the state of plasma emission. The method according to the second embodiment shortens the cleaning time to 50% or less of the cleaning time with known processing and improves the throughput of the substrate processing.

The second process gas used in step ST23 may contain, for example, at least one selected from the group consisting of a fluorine-containing gas, an oxygen-containing gas, a hydrogen-containing gas, and a nitrogen-containing gas. The fluorine-containing gas may be, for example, $CF_4$, $SF_6$, or $NF_3$. The oxygen-containing gas may be, for example, $O_2$, CO, $CO_2$, $H_2O$, or $H_2O_2$. The hydrogen-containing gas may be, for example, $H_2$ or HCl. The nitrogen-containing gas may be, for example, $N_2$. In addition to any of the above gas species, the second process gas may further contain a noble gas such as Ar.

Step ST23 may be performed after each substrate W is processed or after either a predetermined number of substrates W or substrates W with a predetermined number of lots are processed. In some embodiments, step ST23 may be performed after the substrate processing is performed for a predetermined time.

Third Embodiment

In the first and second embodiments, the first process gas contains a hydrogen fluoride gas. The hydrogen fluoride gas is highly corrosive. Thus, the inner walls of the chamber 10 may be coated with a precoat film before the etching processing is performed. In particular, when the first process gas contains a high concentration of the hydrogen fluoride gas, the inner walls of the chamber 10 may be coated with a precoat film to reduce corrosion of the inner walls. This reduces the frequency of maintenance. The inner walls of the chamber 10 include the side wall and the ceiling (the ceiling plate 34 of the upper electrode 30) of the chamber 10, and the substrate support 14.

The precoat film may be formed of a silicon-containing film such as a silicon oxide film, or a material of the same type as the material of the mask MSK. When the mask MSK is a carbon-containing mask, the precoat film may be formed of a carbon-containing material. The carbon-containing material include, for example, at least one selected from the group consisting of spin-on carbon, tungsten carbide, amorphous carbon, and boron carbide. When the mask MSK is a metal-containing mask, the precoat film may be formed of a metal-containing material. The metal-containing material includes, for example, at least one selected from the group consisting of titanium nitride, titanium oxide, and tungsten. When the mask MSK is a boron-containing mask, the precoat film is formed of a boron-containing material. The boron-containing material include, for example, at least one selected from the group consisting of silicon borohydride, boron nitride, and boron carbide.

Figure 7:
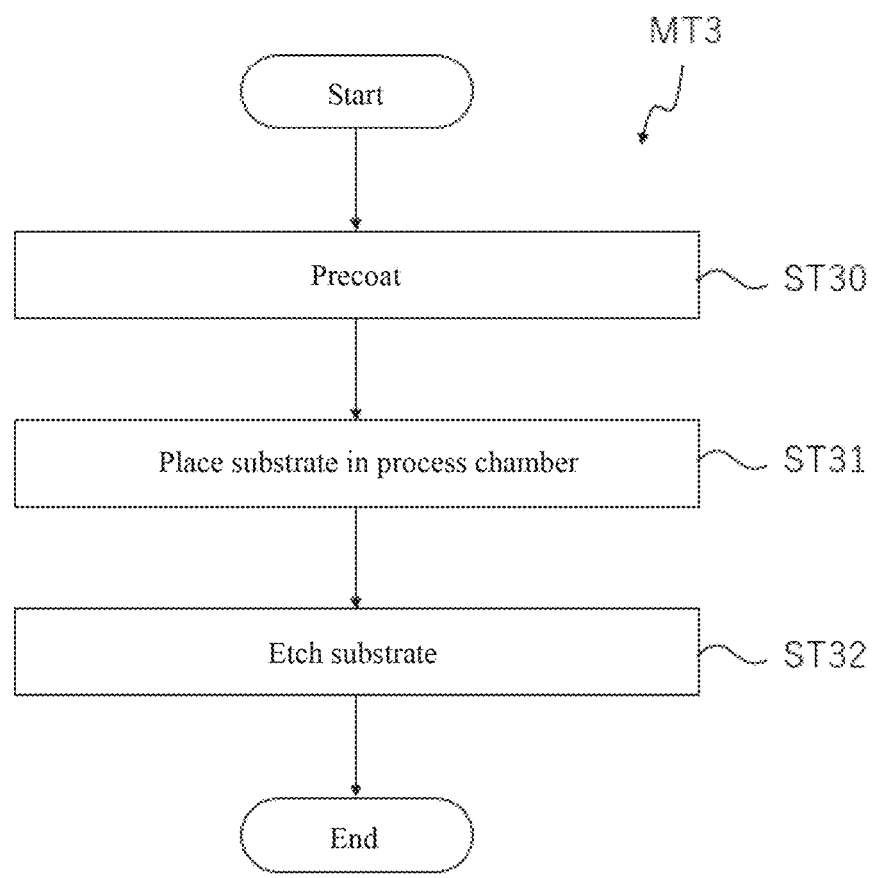
FIG. 7 is a flowchart of an exemplary substrate processing method according to a third embodiment.

FIG. 7 is a flowchart of an exemplary substrate processing method according to a third embodiment. With a method MT3 shown in FIG. 7, a silicon-containing film is etched, as with the method MT1. Steps ST31 and ST32 are identical to steps ST1 and ST2 included in the method MT1 described above, and will not be described.

As shown in FIG. 7, the method MT3 further includes step ST30, which is followed by step ST31. In step ST30, plasma is generated from a third process gas in the chamber 10. In step ST30, the inner walls of the chamber 10 are coated with a precoat film formed from a chemical species contained in the plasma.

The precoat film may be deposited using the third process gas through chemical vapor deposition (CVD) or atomic layer deposition (ALD). When a precoat film is a silicon oxide film, the third process gas may be a silicon-containing gas such as $SiCl_4$ or an aminosilane gas or may be an oxygen-containing gas such as $O_2$.

Step ST30 may be performed after each substrate W is processed, or after either a predetermined number of substrates W or substrates W with a predetermined number of lots are processed. In some embodiments, step ST30 may be performed after the substrate processing is performed for a predetermined time.

Figure 8:
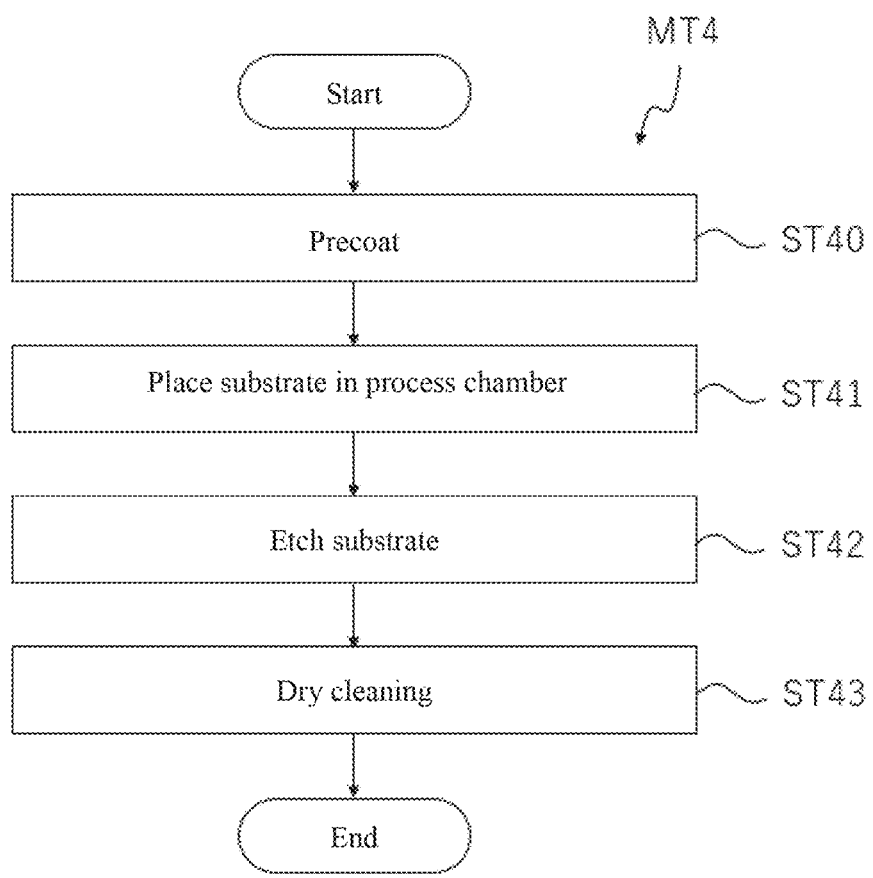
FIG. 8 is a flowchart of an exemplary substrate processing method according to a modification of the third embodiment.

The process for depositing the precoat film may be combined with a cleaning process as described for the substrate processing method shown in FIG. 8 according to a modification of the third embodiment. The modification can reduce both production of particles and corrosion of the inner walls of the chamber 10.

Although the exemplary embodiments have been described above, the embodiments are not restrictive, and various omissions, substitutions, and changes may be made. The components in the different exemplary embodiments may be combined to form another exemplary embodiment.

The plasma processing apparatus that uses the methods MT1 to MT4 may be a plasma processing apparatus different from the plasma processing apparatus 1. The plasma processing apparatus that uses the methods MT1 to MT4 may be another capacitively coupled plasma processing apparatus, an inductively coupled plasma processing apparatus, or a plasma processing apparatus that generates plasma using surface waves such as microwaves.

As described above, the hydrogen fluoride gas is highly corrosive. The flow rate ratio of the hydrogen fluoride gas or the type of gas to be added to the first process gas may be changed as appropriate as the processing is performed in stages. For example, the flow rate ratio of the hydrogen fluoride gas in the final stage of the etching that may not need to retain the mask thickness may be controlled to be lower than the flow rate ratio of the hydrogen fluoride gas in the initial to intermediate stages of etching that needs to retain the mask thickness. In other examples, in etching of an area with a low aspect ratio that is likely to have failures, such as bowing, in the resultant features, the flow rate ratio of a gas that effectively protects the side wall may be increased more than the flow rate ratio of the gas used in etching of an area with a high aspect ratio. The etched features may be monitored using an optical observation device. The flow rate ratio of the hydrogen fluoride gas, or the type of gas added to the first process gas or its flow rate ratio may also be changed in accordance with the etched features.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure is defined by the appended claims.

REFERENCE SIGNS LIST 1 plasma processing apparatus
10 chamber
W substrate
SF film
MSK mask

What is claimed is:

1. A substrate processing method, comprising:
   placing a substrate in a chamber, the substrate including a silicon-containing film and a mask on the silicon-containing film; and
   generating plasma from a first process gas containing a hydrogen fluoride gas and a carbon-containing gas in the chamber and etching the silicon-containing film,
   wherein a flow rate of the hydrogen fluoride gas is at least 80 vol % of a total flow rate of the first process gas excluding an inert gas being a noble gas and/or a nitrogen-containing gas.

2. The substrate processing method according to claim 1, wherein
   the carbon-containing gas contains at least one selected from the group consisting of a fluorocarbon gas, a hydrofluorocarbon gas, and a hydrocarbon gas.

3. The substrate processing method according to claim 1, wherein
   the silicon-containing film includes at least one selected from the group consisting of a film stack including a silicon oxide film and a silicon nitride film, a polysilicon film, a film with a low dielectric constant, and a film stack including a silicon oxide film and a polysilicon film.

4. The substrate processing method according to claim 1, wherein
   the mask includes a carbon-containing mask or a metal-containing mask.

5. The substrate processing method according to claim 4, wherein
   the carbon-containing mask comprises at least one selected from the group consisting of spin-on carbon, tungsten carbide, amorphous carbon, and boron carbide.

6. The substrate processing method according to claim 1, further comprising:
   generating plasma from a second process gas in the chamber and cleaning an inside of the chamber.

7. The substrate processing method according to claim 6, wherein
   the second process gas contains at least one selected from the group consisting of a fluorine-containing gas, an oxygen-containing gas, a hydrogen-containing gas, and a nitrogen-containing gas.

8. The substrate processing method according to claim 1, further comprising:
   generating plasma from a third process gas in the chamber and depositing a precoat film on an inner wall of the chamber before the placing the substrate.

9. The substrate processing method according to claim 8, wherein
   the third process gas contains a silicon-containing gas and an oxygen-containing gas.

10. The substrate processing method according to claim 1, wherein the first process gas further comprises $WF_6$ gas.

11. The substrate processing method according to claim 1, wherein the first process gas further comprises at least one selected from the group consisting of $PF_3$ gas, $PF_5$ gas, $PCl_3$ gas, $PCl_5$ gas, $PBr_3$ gas, $PBr_5$ gas and $PI_3$ gas.

12. The substrate processing method according to claim 1, wherein the first process gas further comprises at least one selected from the group consisting of $PF_3$ gas, $PF_5$ gas, $PCl_3$ gas and $PCl_5$ gas.

13. The substrate processing method according to claim 1, wherein the carbon-containing gas contains at least one selected from the group consisting $CF_4$, $C_2F_2$, $C_2F_4$, $C_3F_8$, $C_4F_6$, $C_4F_8$, and $C_5F_8$.

14. The substrate processing method according to claim 1, wherein the carbon-containing gas contains at least one selected from the group consisting $CHF_3$, $CH_2F_2$, $CH_3F$, $C_2HF_5$, $C_2H_2F_4$, $C_2H_3F_3$, $C_2H_4F_2$, $C_3HF_7$, $C_3H_2F_6$, $C_3H_2F_4$, $C_3H_3F_5$, $C_4H_5F_5$, $C_5H_2F_{10}$, c-$C_5H_3F_7$, and $C_3H_2F_4$.

15. The substrate processing method according to claim 1, wherein the carbon-containing gas contains at least one selected from the group consisting $CH_4$, $C_2H_6$, $C_3H_6$, $C_3H_8$, and $C_4H_{10}$.

16. The substrate processing method according to claim 1, further comprising:
   adjusting a temperature of an electrostatic chuck on which the substrate is placed to 0° C. or lower before the generating plasma and the etching.

17. A substrate processing method comprising:
   placing a substrate in a chamber, the substrate including a silicon-containing film and a mask on the silicon-containing film;
   adjusting a temperature of an electrostatic chuck on which the substrate is placed to 0° C. or lower; and generating plasma from a first process gas containing a hydrogen fluoride gas in the chamber and etching the silicon-containing film, wherein a flow rate of the hydrogen fluoride gas is at least 80 vol % of a total flow rate of the first process gas excluding an inert gas being a noble gas and/or a nitrogen-containing gas.

18. The substrate processing method according to claim 17, wherein the first process gas further comprises $WF_6$ gas.

19. The substrate processing method according to claim 17, wherein the first process gas further comprises at least one selected from the group consisting of $PF_3$ gas, $PF_5$ gas, $PCl_3$ gas, $PCl_5$ gas, $PBr_3$ gas, $PBr_5$ gas and $PI_3$ gas.

20. The substrate processing method according to claim 17, wherein the first process gas further comprises at least one selected from the group consisting of $PF_3$ gas, $PF_5$ gas, $PCl_3$ gas and $PCl_5$ gas.

21. A substrate processing method, comprising:
placing a substrate in a chamber, the substrate including a silicon-containing film and a mask on the silicon-containing film;
controlling with a controller a flow of a hydrogen fluoride gas into the chamber; and
generating plasma from a first process gas containing a hydrogen fluoride gas and a carbon-containing gas in the chamber and etching the silicon-containing film,
wherein the controlling includes controlling a flow rate of the hydrogen fluoride gas to be at least 80 vol % of a total flow rate of the first process gas excluding an inert gas being a noble gas and/or a nitrogen-containing gas.

22. The substrate processing method according to claim 21, wherein
the carbon-containing gas contains at least one selected from the group consisting of a fluorocarbon gas, a hydrofluorocarbon gas, and a hydrocarbon gas.

23. The substrate processing method according to claim 21, wherein
the silicon-containing film includes at least one selected from the group consisting of a film stack including a silicon oxide film and a silicon nitride film, a polysilicon film, a film with a low dielectric constant, and a film stack including a silicon oxide film and a polysilicon film.

24. The substrate processing method according to claim 21, wherein
the mask includes a carbon-containing mask or a metal-containing mask.

25. The substrate processing method according to claim 24, wherein
the carbon-containing mask comprises at least one selected from the group consisting of spin-on carbon, tungsten carbide, amorphous carbon, and boron carbide.

26. The substrate processing method according to claim 21, further comprising:
generating plasma from a second process gas in the chamber and cleaning an inside of the chamber.

27. The substrate processing method according to claim 26, wherein
the second process gas contains at least one selected from the group consisting of a fluorine-containing gas, an oxygen-containing gas, a hydrogen-containing gas, and a nitrogen-containing gas.

28. The substrate processing method according to claim 21, wherein the first process gas further comprises $WF_6$ gas.

29. The substrate processing method according to claim 21, wherein the first process gas further comprises at least one selected from the group consisting of $PF_3$ gas, $PF_5$ gas, $PCl_3$ gas, PClS gas, $PBr_3$ gas, $PBr_5$ gas and $PI_3$ gas.

30. The substrate processing method according to claim 21, wherein the first process gas further comprises at least one selected from the group consisting of $PF_3$ gas, $PF_5$ gas, $PCl_5$ gas and $PCl_5$ gas.

31. The substrate processing method according to claim 21, wherein the carbon-containing gas contains at least one selected from the group consisting $CF_4$, $C_2F_2$, $C_2F_4$, $C_3F_8$, $C_4F_6$, $C_4F_8$, and $C_5F_8$.

32. The substrate processing method according to claim 21, wherein the carbon-containing gas contains at least one selected from the group consisting $CHF_3$, $CH_2F_2$, $CH_3F$, $C_2HF_5$, $C_2H_2F_4$, $C_2H_3F_3$, $C_2H_4F_2$, $C_3HF_7$, $C_3H_2F_6$, $C_3H_2F_4$, $C_3H_3F_5$, $C_4H_5F_5$, $C_5H_2F_{10}$, c-$C_5H_3F_7$, and $C_3H_2F_4$.

33. The substrate processing method according to claim 21, wherein the carbon-containing gas contains at least one selected from the group consisting $CH_4$, $C_2H_6$, $C_3H_6$, $C_3H_8$, and $C_4H_{10}$.

34. The substrate processing method according to claim 21, further comprising:
adjusting a temperature of an electrostatic chuck on which the substrate is placed to 0° C. or lower before the generating plasma and the etching.

35. A substrate processing method comprising:
placing a substrate in a chamber, the substrate including a silicon-containing film and a mask on the silicon-containing film;
adjusting a temperature of an electrostatic chuck on which the substrate is placed to 0° C. or lower;
controlling with a controller a flow of a hydrogen fluoride gas into the chamber; and
generating plasma from a first process gas containing a hydrogen fluoride gas in the chamber and etching the silicon-containing film,
wherein the controlling includes controlling a flow rate of the hydrogen fluoride gas to be at least 80 vol % of a total flow rate of the first process gas excluding an inert gas being a noble gas and/or a nitrogen-containing gas.

36. The substrate processing method according to claim 35, wherein the first process gas further comprises $WF_6$ gas.

37. The substrate processing method according to claim 35, wherein the first process gas further comprises at least one selected from the group consisting of $PF_3$ gas, $PF_5$ gas, $PCl_3$ gas, $PCl_5$ gas, $PBr_3$ gas, $PBr_5$ gas and $PI_3$ gas.

38. The substrate processing method according to claim 35, wherein the first process gas further comprises at least one selected from the group consisting of $PF_3$ gas, $PF_5$ gas, $PCl_3$ gas and $PCl_5$ gas.

39. A substrate processing method, comprising:
placing a substrate in a chamber, the substrate including a silicon-containing film and a mask on the silicon-containing film;
controlling with a controller a flow of a hydrogen fluoride gas into the chamber;
generating plasma from a first process gas containing a hydrogen fluoride gas and a carbon-containing gas in the chamber; and
a step for etching the silicon-containing film,
wherein the controlling includes controlling a flow rate of the hydrogen fluoride gas to be at least 80 vol % of a total flow rate of the first process gas excluding an inert gas being a noble gas and/or a nitrogen-containing gas.

* * * * *